(12) United States Patent
Otremba et al.

(10) Patent No.: US 9,117,786 B2
(45) Date of Patent: Aug. 25, 2015

(54) CHIP MODULE, AN INSULATION MATERIAL AND A METHOD FOR FABRICATING A CHIP MODULE

(71) Applicant: Infineon Technologies AG, Neubiberg (DE)

(72) Inventors: Ralf Otremba, Kaufbeuren (DE); Josef Hoeglauer, Kirchheim-Heimstetten (DE); Juergen Schredl, Mering (DE); Xaver Schloegel, Sachsenkam (DE); Klaus Schiess, Allensbach (DE)

(73) Assignee: Infineon Technologies AG, Neubiberg (DE)

( * ) Notice: Subject to any disclaimer, the term of this patent is extended or adjusted under 35 U.S.C. 154(b) by 163 days.

(21) Appl. No.: 13/693,205

(22) Filed: Dec. 4, 2012

(65) Prior Publication Data

US 2014/0151856 A1 Jun. 5, 2014

(51) Int. Cl.
*H01L 23/12* (2006.01)
*H01L 23/34* (2006.01)
*H01L 21/56* (2006.01)
*H01L 23/36* (2006.01)
*H01L 23/373* (2006.01)
*H01L 23/498* (2006.01)
*H01L 23/538* (2006.01)

(52) U.S. Cl.
CPC ............... *H01L 23/34* (2013.01); *H01L 21/56* (2013.01); *H01L 23/36* (2013.01); *H01L 23/3735* (2013.01); *H01L 23/49827* (2013.01); *H01L 23/5389* (2013.01); *H01L 2924/0002* (2013.01)

(58) Field of Classification Search
USPC .............. 257/701, 632, E33.06, E23.049, 257/E23.056, E23.08
See application file for complete search history.

(56) References Cited

U.S. PATENT DOCUMENTS

| | | | | |
|---|---|---|---|---|
| 4,744,007 A | * | 5/1988 | Watari et al. | 361/718 |
| 2005/0194900 A1 | * | 9/2005 | Kim et al. | 313/582 |
| 2006/0115943 A1 | * | 6/2006 | Koyanagi | 438/197 |
| 2008/0191339 A1 | * | 8/2008 | Otremba et al. | 257/702 |
| 2009/0083963 A1 | | 4/2009 | Otremba | |
| 2009/0115061 A1 | * | 5/2009 | Chen | 257/751 |
| 2009/0133912 A1 | * | 5/2009 | Miyata et al. | 174/260 |

FOREIGN PATENT DOCUMENTS

| | | |
|---|---|---|
| DE | 10 2008 008 515 A1 | 9/2008 |
| DE | 10 2008 046 728 A1 | 5/2009 |

* cited by examiner

*Primary Examiner* — Timor Karimy
(74) *Attorney, Agent, or Firm* — Slater & Matsil, L.L.P.

(57) ABSTRACT

The chip module includes a carrier, a semiconductor chip arranged on or embedded inside the carrier, and an insulation layer that at least partly covers a face of the carrier. The dielectric constant $\in_r$ and the thermal conductivity $\lambda$ of the insulation layer satisfy the condition $\lambda \cdot \in_r < 4.0 \; W \cdot m^{-1} \cdot K^{-1}$.

17 Claims, 4 Drawing Sheets

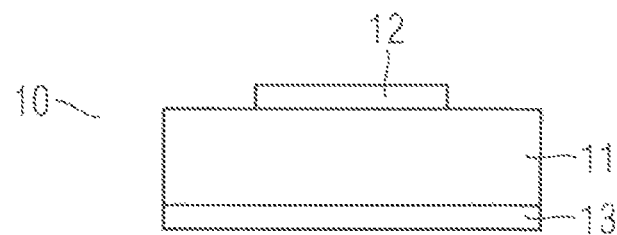
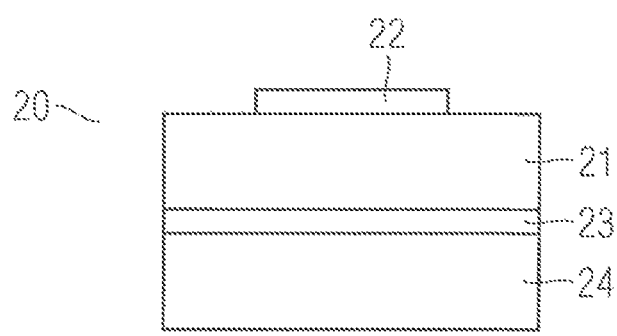

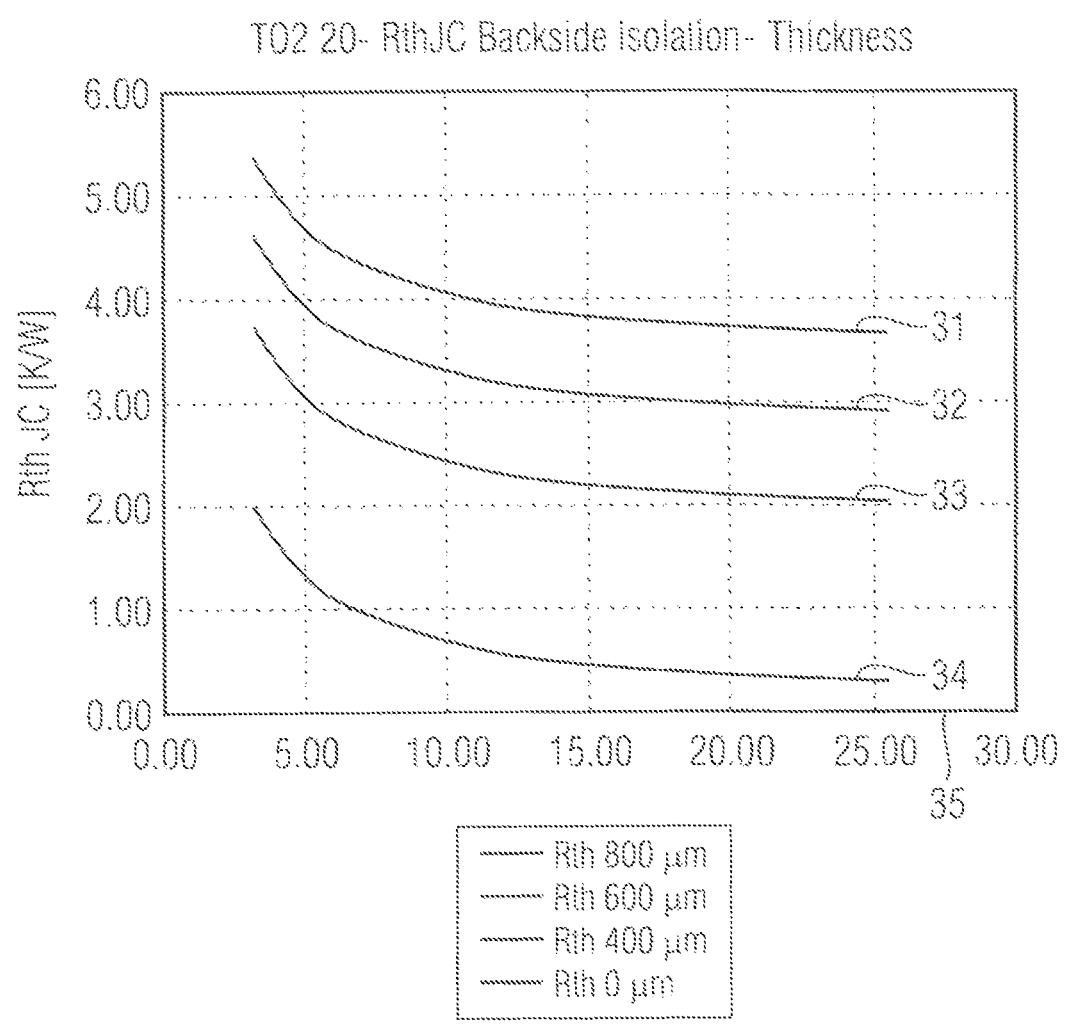

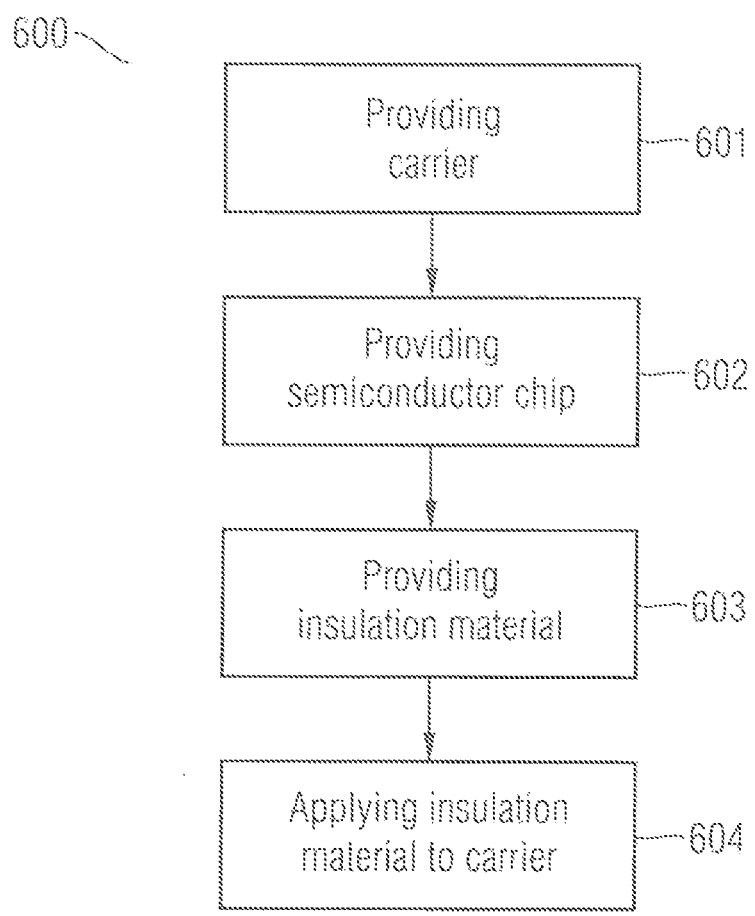

CHIP MODULE, AN INSULATION MATERIAL AND A METHOD FOR FABRICATING A CHIP MODULE

TECHNICAL FIELD

The present invention relates to a chip module, an insulation material and a method for fabricating a chip module.

BACKGROUND

In a chip module a semiconductor chip may be arranged on a carrier and may generate heat. In order to prevent damage caused by excessive temperatures, a heat conducting insulation layer may be provided to convey the heat to, for example, a heat sink.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 shows a schematic cross-sectional side view representation of a chip module according to an embodiment;

FIG. 2 shows a schematic cross-sectional side view representation of a chip module according to an embodiment;

FIG. 3 shows the relation between thermal resistance and dimensions of materials used for insulation;

FIG. 6 shows a flow diagram for illustrating a method for fabricating a chip module according to an embodiment.

DETAILED DESCRIPTION OF ILLUSTRATIVE EMBODIMENTS

Figure 4:
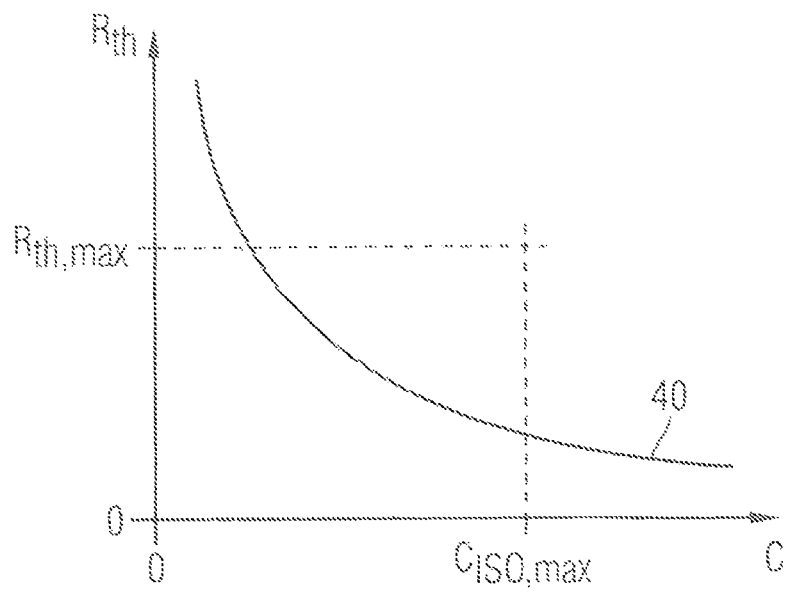
FIG. 4 shows the relationship between thermal resistance and electrical capacity of insulation layers.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a chip module and a method for fabricating a chip module may use various types of semiconductor chips or circuits incorporated in the semiconductor chips, among them AC/DC or DC/DC converter circuit, power MOS transistor, power Schottky diode, logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip. Moreover, the embodiments of insulation materials may, for example, be used for providing insulation layers in various types of enclosures and insulation for electrical circuits and components, and/or for providing insulation layers in various types of semiconductor chips or circuits incorporated in semiconductor chips, including the above mentioned semiconductor chips and circuits.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

In the claims and in the following description different embodiments of a method for fabricating a chip module are described as a particular sequence of processes or measures, in particular in a flow diagram. It is to be noted that the embodiments should not be limited to the particular sequence described. Particular ones or all of different processes or measures can also be conducted simultaneously or in any other useful and appropriate sequence.

The chip modules as described in this application comprise a carrier. The carrier may comprise or consist of any sort of material as, for example, ceramic or metallic material, copper or copper alloy or iron/nickel alloy. The carrier can be connected mechanically and electrically with one contact element of the semiconductor chip. The semiconductor chip can be connected to the carrier by one or more of re-flow soldering, vacuum soldering, diffusion soldering, or adhering by means of a conductive adhesive. If diffusion soldering is used as the connection technology between the semiconductor chip and the carrier, solder materials can be used which result in inter-metallic phases at the interface between the semiconductor and the carrier due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip is to be adhered to the carrier, conductive adhesives can be used. The adhesives can, for example, be based on epoxy resins which can be enriched with particles of gold, silver, nickel or copper to enhance their electrical conductivity.

The contact elements of the semiconductor chip may comprise a diffusion barrier. The diffusion barrier prevents in case of diffusion soldering that the solder material diffuses from the carrier in the semiconductor chip. A thin titanium layer on the contact element may, for example, effect such a diffusion barrier.

Referring to FIG. 1, there is shown a schematic cross-sectional side view representation of a chip module according to an embodiment. A chip module 10 according to FIG. 1 comprises a semiconductor chip 12, a carrier 11 on which the semiconductor chip 12 is arranged and an insulation layer 13 covering a face of the carrier 11.

The insulation layer 13 provides an electrical insulation between the carrier 11 contacting the upper face of the insulation layer 13 and the lower face of the insulation layer 13. When operating the semiconductor chip 12, excessive heat may be generated which should be conveyed away from the semiconductor chip 12 to prevent damage due to undesired temperature rise. The amount of heat, which can be conveyed away from the semiconductor chip 12 through the carrier 11 and insulation layer 13, depends on the thermal conductance of the layers involved. Thus, by increasing the thermal conductance of the insulation layer 13, the heat transfer through the layer may be improved. The material used in the insulation layer can be selected as discussed below.

Referring to FIG. 2, there is shown a schematic cross-sectional side view representation of a chip module according to an embodiment. A chip module 20 according to FIG. 2 comprises a semiconductor chip 22, a carrier 21 on which the semiconductor chip 22 is arranged and an insulation layer 23 covering a face of the carrier 21. The chip module 20 according to FIG. 2 further comprises a heat sink 24, which is arranged on a surface of the insulation layer 23 opposite to the carrier 21. The heat sink 24 receives and/or dissipates heat generated by the semiconductor chip 22, i.e., heat is conveyed away from the semiconductor chip 22 to the heat sink 24 through the carrier 21 and insulation layer 23. Thus, by increasing the thermal conductance of the insulation layer 23, the cooling effect is improved by improving the heat transfer to the heat sink. The material used in the insulation layer can be selected as follows.

Referring to FIG. 3, there is shown a diagram illustrating how the reciprocal of thermal conductance, namely the thermal resistance Rth of the insulation layer, depends on the area 35 and thickness 31, 32, 33, 34, 35 of the layer, corresponding to the equation:

$$Rth = \lambda^{-1} \cdot (\text{thickness/area}),$$

wherein $\lambda$ is the thermal conductivity of the material used in the insulation layer. The curves 31, 32, 33 and 34 relate to the insulation layer thicknesses 800 µm, 600 µm, 400 µm and 0 µm, respectively. Thus, FIG. 3 indicates that the thermal conductance of the insulation layer 13, 23 given in FIGS. 1 and 2 may be improved by reducing its thickness or by increasing its area.

However, the electrical capacitance of the insulation layer 13, 23 shown in FIGS. 1 and 2, is determined by the equation:

$$C = \epsilon_0 \cdot \epsilon_r \cdot (\text{area/thickness}),$$

wherein the area and thickness relates to dimensions of the insulation layer 13, 23, $\epsilon_0$ is the electrical constant and $\epsilon_r$ the dielectric constant of the insulation material. Thus, by reducing the thickness or by increasing the area of the insulation layer 23, the electrical capacitance of the insulation layer 13, 23 is increased.

Increasing the electrical capacitance of the insulation layer 13, 23 can have adverse effects on the chip module 10, 20 performance. For example, increasing the electrical capacitance can result in larger dynamic currents oscillating to and from the respective capacitor inside the chip module. In particular, when operating chip modules using higher frequencies, e.g., to allow the use of electrical components having smaller dimensions, respective ohmic losses due to the above mentioned dynamic currents may increase. Consequently, the power loss due to dynamic currents may lower the power efficiency of the chip module and increase the heat generation inside the chip module. Such deteriorating effects may also be apparent, although perhaps less significant, at lower frequencies.

Moreover, increasing the electrical capacitance of the insulation layer 13, 23 reduces the impedance of the layer which can support cross-talk, in particular during operation at higher frequencies. Such cross-talk may result in undesired energy dissipation over the insulation layer 13, 23, which may reduce the power efficiency of the chip module 10, 20 or increase the heat generation in the chip module 10, 20. Furthermore, such cross-talk may emit electrical signals, in particular high frequency signals, through the insulation layer 13, 23, which may cause undesired electromagnetic interferences, e.g., to neighboring electrical equipment or components.

In the embodiments according to FIGS. 1 and 2, the selection of the material used in the insulation layer can take account of obtaining low thermal resistance Rth for improved heat transfer from the semiconductor chip 12, 22, but also of avoiding unduly increasing the capacitance of the insulation layer 13, 23. In other words, in order to account for the undesired dynamic current power losses in the chip module 10, 20 and the electromagnetic interferences transmitted through the insulation layer 13, 23, the material used in the insulation layer can be selected to satisfy the inequality, $$Rth \cdot C = \epsilon_0 \cdot \epsilon_r \cdot \lambda^{-1} < \text{ISOmax},$$

wherein ISOmax represents an upper limit for the product $\epsilon_0 \cdot \epsilon_r \cdot \lambda^{-1}$.

FIG. 4 shows the relation 40 between Rth and C given for a fixed value of the product Rth·C, wherein the fixed value corresponds with a selection of material used in the insulation layer 13, 23. Different points on the curve 40 can be selected by varying the area or thickness of the insulation layer 13, 23. In other words, the product Rth·C relates to the material used, but does not depend on the dimensions of the insulation layer 13, 23. The dimensions of the insulation layer 13, 23 may be selected to satisfy additional conditions, such as, for example, to limit the insulation layer 13, 23 to a maximum thermal resistance Rth,max or to a maximum electrical capacitance $C_{ISO}$, max, as shown in FIG. 4.

The material satisfying the above inequality $\in_0 \cdot \in_r \cdot \lambda < ISOmax$ also satisfies $\in_r \cdot \lambda^{-1} < ISOmax/\in_0$, because the electrical constant $\in_0$ is independent on the material used. For example, according to the embodiments shown in FIGS. 1 and 2, the material used in the insulation layer 13, 23 satisfies the condition $\lambda \cdot \in_r < 4.0$ W·m$^{-1}$·K$^{-1}$.

Figure 5:
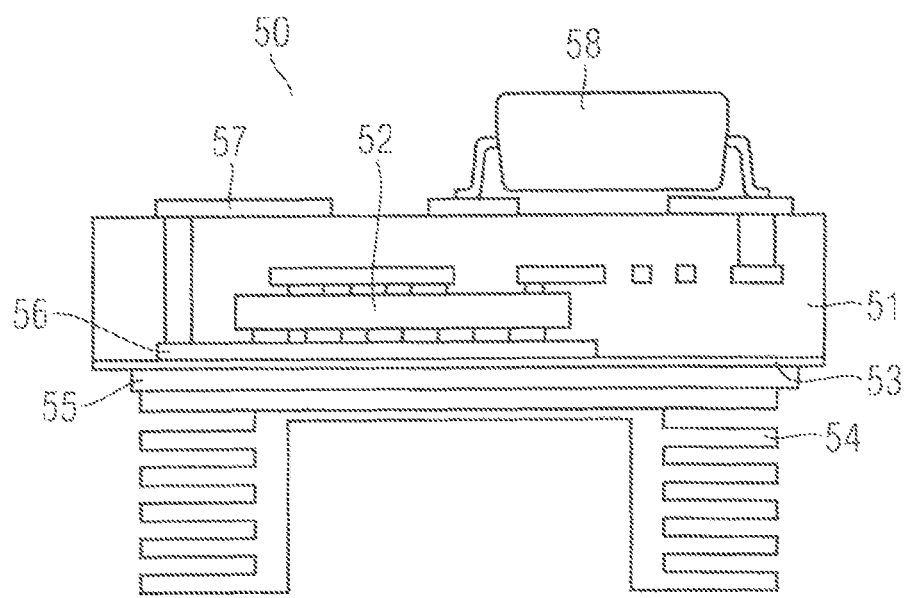
FIG. 5 shows a schematic cross-sectional side view representation of a chip module according to an embodiment.

Referring to FIG. 5, there is shown a schematic cross-sectional side view representation of a chip module 50 according to an embodiment. A chip module 50 according to FIG. 5 comprises a carrier 51, a semiconductor chip 52 embedded in the carrier 51 and an insulation layer 53 covering a face of the carrier 51. The semiconductor chip is provided with contacts 56, 57 extending the connections of the semiconductor chip 52 to the upper surface of the carrier 51. Additional electrical components 58 may, for example, be provided on the upper surface of the carrier 51. The chip module 50 according to FIG. 5 further comprises a heat sink 54 including a metal layer 55, which is arranged on the bottom surface of the insulation layer 53. Also in this embodiment, the material used in the insulation layer 13, 23 can be porous and/or selected to satisfy the condition $\lambda \cdot \in_r < 4.0$ W·m$^{-1}$·K$^{-1}$.

According to an embodiment of the chip module 10, 20, 50 of any of FIG. 1, 2 or 5, the dielectric constant $\in_r$ and the thermal conductivity $\lambda$ of the insulation layer 13, 23, 53 satisfies $\lambda \cdot \in_r < 3.5$ W·m$^{-1}$·$^{-1}$, $\lambda \cdot \in_r < 3.0$ W·m$^{-1}$·K$^{-1}$, $\lambda \cdot \in_r < 2.0$ W·m$^{-1}$·K$^{-1}$ or $\lambda \cdot \in_r < 1.0$ W·m$^{-1}$·K$^{-1}$.

According to an embodiment of the chip module 10, 20, 50 of any of FIG. 1, 2 or 5, the insulation layer comprises porous material. The porosity of the porous material is a measure of the amount of empty spaces in the material, e.g., spaces filled with air, and is a percentage of the empty spaces over the total volume of the insulation layer 13, 23, 53. For example, in an embodiment, porosity of the insulation layer 13, 23, 53 may be selected larger than 25%, 50% or 60%.

According to an embodiment of the chip module 10, 20, 50 of any of FIG. 1, 2 or 5, the material used in the insulation layer comprises at least one of silicon dioxide, fluorine-doped silicon dioxide, carbon-doped silicon dioxide, polymeric dielectric, nitride or metal oxide.

According to an embodiment of the chip module 10, 20, 50 of any of FIG. 1, 2 or 5, the dielectric constant $\in_r$ of the insulation layer is lower than 3.5, 3.0, 2.0 or 1.5. For example, it may be possible by lowering the maximum value of the dielectric constant $\in_r$ to reduce the capacitance of the insulation layer, e.g., for reduced cross-talk and power loss as discussed above.

Similarly, according to an embodiment of the chip module 10, 20, 50 of any of FIG. 1, 2 or 5, the thermal conductivity $\lambda$ of the insulation layer may be selected larger than 0.7 W·m$^{-1}$·K$^{-1}$, 1.0 W·m$^{-1}$·K$^{-1}$ or 1.3 W·m$^{-1}$·K$^{-1}$. For example, it may be possible by increasing the minimum value of the thermal conductivity $\lambda$ to reduce the thermal resistance Rth of the insulation layer, e.g., for improved heat transfer over the insulation layer 13, 23, 53 as discussed above.

According to an embodiment of the chip module 10, 20, 50 of any of FIG. 1, 2 or 5, the thickness of the insulation layer 13, 23, 53 is less than 100 µm, 10 µm or 5 µm. According to a further embodiment of the chip module, the insulation layer 13, 23, 53 partly covers the respective face of the carrier 11, 21, 51.

According to an embodiment of the chip module 10, 20, 50 of any of FIG. 1, 2 or 5, the chip module 20, 50 may or may not comprise a heat sink 24, 54, wherein the heat sink may be arranged on a surface of the insulation layer 23, 53 which is opposite to the carrier. For example, in an embodiment comprising or not comprising a heat sink 24, 54, the chip module 10, 20, 50 may comprise a through hole (not shown in figures) provided for attaching the chip module 20, 50 to an external heat sink 24, 54, wherein the through hole extends through the carrier 11, 21, 51 and insulation layer 13, 23, 53.

Further embodiments of the chip module can be formed along the features and embodiments as described before in connection with the embodiments shown in FIGS. 1, 2 and 5.

According to an embodiment of an insulation material, for example as used in the embodiments of the chip modules 10, 20, 50 shown in FIGS. 1, 2 and 5, the dielectric constant $\in_r$ and the thermal conductivity $\lambda$ of the insulation material satisfies the condition $\lambda \in_r < 4.0$ W m$^{-1}$·K$^{-1}$. In a further embodiment of the insulation material, the dielectric constant $\in_r$ and the thermal conductivity $\lambda$ may satisfy $\lambda \cdot \in_r < 3.5$ W·m$^{-1}$·K$^{-1}$, $\lambda \cdot \in_r < 3.0$ W·m$^{-1}$·K$^{-1}$, $\lambda \cdot \in_r < 2.0$ W·m$^{-1}$·K$^{-1}$ or $\lambda \cdot \in_r < 1.0$ W·m$^{-1}$·K$^{-1}$.

According to an embodiment of the insulation material, the insulation material is a porous material. For example, the porosity of the insulation material may be larger than 25%, 50% or 60%.

According to an embodiment of the insulation material, the insulation material comprises at least one of silicon dioxide, fluorine-doped silicon dioxide, carbon-doped silicon dioxide, polymeric dielectric, nitride or metal oxide.

According to an embodiment of the insulation material, the dielectric constant $\in_r$ may be lower than 3.5, 3.0, 2.0 or 1.5. Alternatively, the thermal conductivity $\lambda$ may be larger than 0.7 W·m$^{-1}$·K$^{-1}$, 1.0 W·m$^{-1}$·K$^{-1}$ or 1.3 W·m$^{-1}$·K$^{-1}$.

The above described insulation material may be comprised in an embodiment of a substrate for carrying electrical components. In particular, an embodiment of a substrate for carrying electrical components may comprise the insulation material which has been applied to a surface of the substrate.

Referring to FIG. 6, there is shown a flow diagram of a method for fabricating a chip module according to an embodiment. The method 600 comprises providing a carrier (block 601), providing a semiconductor chip and arranging the semiconductor chip on or embedding the semiconductor chip inside the carrier (block 602), providing an insulation material, wherein the dielectric constant $\in_r$ and the thermal conductivity $\lambda$ of the insulation material satisfies the condition $\lambda \cdot \in_r < 4.0$ W·m$^{-1}$·K$^{-1}$ (block 603) and applying the insulation material to form an insulation layer at least partly covering a face of the carrier (block 604).

According to an embodiment of the method of FIG. 6, the insulation layer is provided (block 603) as a porous material or even as a porous material having porosity larger than 25%, 50% or 60%.

According to an embodiment of the method of FIG. 6, the insulation layer is provided having the dielectric constant $\in_r$ and the thermal conductivity $\lambda$ satisfying $\lambda \in_r < 3.5$ W·m$^{-1}$·K$^{-1}$, $\lambda \cdot \in_r < 3.0$ W·m$^{-1}$·K$^{-1}$, $\lambda \cdot \in_r < 2.0$ W·m$^{-1}$·K$^{-1}$ or $\lambda \cdot \in_r < 1.0$ W·m$^{-1}$·K$^{-1}$.

According to an embodiment of the method of FIG. 6, the insulation layer is applied on the face of the carrier as a film or by depositing or forming the insulation layer using etch, UV curing, vapor deposition or spin-on processes. Further, the insulation layer may formed by one or more of printing or spinning or can be structured by conventional photolithography.

It is worth to note, however, that in some embodiments the steps of providing the insulation material (block 603) and applying the insulation material to the carrier (block 604), may be performed simultaneously, i.e., where the insulation material is provided directly on the carrier. The same applies to the steps of providing, arranging and embedding a semiconductor chip, i.e., the step of providing a semiconductor chip by arranging the semiconductor chip on or by embedding the semiconductor chip inside the carrier (block 602).

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A chip module, comprising:
   a semiconductor chip;
   a carrier, wherein the semiconductor chip is arranged on or embedded inside the carrier; and
   an insulation layer at least partly covering a face of the carrier, wherein a dielectric constant $\in_r$ and a thermal conductivity $\lambda$ of the insulation layer satisfy the condition $\lambda \cdot \in_r < 1.0 \ \text{W} \cdot \text{m}^{-1} \cdot \text{K}^{-1}$.

2. The chip module according to claim 1, wherein the insulation layer comprises a porous material.

3. The chip module according to claim 2, wherein the porosity of the porous material is greater than 50%.

4. The chip module according to claim 1, wherein the insulation layer comprises at least one polymeric dielectric.

5. The chip module according to claim 1, wherein the dielectric constant $\in_r$ of the insulation layer is lower than 2.0.

6. The chip module according to claim 1, wherein a thickness of the insulation layer is less than 10 μm.

7. The chip module according to claim 1, wherein the carrier is ceramic or metallic.

8. The chip module according to claim 1, further comprising a through hole for attaching the chip module to an external heat sink, wherein the through hole extends through the carrier and the insulation layer.

9. The chip module according to claim 1, further comprising a heat sink arranged on a surface of the insulation layer, the surface opposite a surface facing the carrier.

10. The chip module according to claim 1, wherein the semiconductor chip comprises at least one of a power integrated circuit, an AC/DC or DC/DC converter circuit, a power MOS transistor, a power Schottky diode, a vertical transistor structure or an insulated gate bipolar transistor.

11. An insulation material having a dielectric constant $\in_r$ and a thermal conductivity $\lambda$ which satisfy the condition $\lambda \cdot \in_r < 1.0 \ \text{W} \cdot \text{m}^{-1} \cdot \text{K}^{-1}$.

12. The insulation material according to claim 11, wherein the material is a porous material.

13. The insulation material according to claim 12, wherein the porosity of the material is larger than 60%.

14. The insulation material according to claim 11, wherein the insulation material comprises at least one polymeric dielectric.

15. The insulation material according to claim 11, wherein the dielectric constant $\in_r$ is lower than 1.5.

16. A substrate for carrying electrical components, the substrate comprising an insulation material having a dielectric constant $\in_r$ and a thermal conductivity $\lambda$ which satisfy the condition $\lambda \cdot \in_r < 1.0 \ \text{W} \cdot \text{m}^{-1} \cdot \text{K}^{-1}$.

17. The substrate according to claim 16, further comprising a substrate base material, wherein the insulation material has been applied to a surface of the substrate base material.

* * * * *